(12) United States Patent
Goudarzi

(10) Patent No.: US 7,132,745 B2
(45) Date of Patent: Nov. 7, 2006

(54) METHOD FOR ATTACHING SHIELDS ON SUBSTRATES

(75) Inventor: Vahid Goudarzi, Coral Springs, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/806,644

(22) Filed: Mar. 23, 2004

(65) Prior Publication Data

US 2005/0212102 A1    Sep. 29, 2005

(51) Int. Cl.
*H01L 23/10* (2006.01)
(52) U.S. Cl. .............................. 257/710; 257/E23.183; 257/E23.193
(58) Field of Classification Search ................ 257/667, 257/704, 710
See application file for complete search history.

(56) References Cited

U.S. PATENT DOCUMENTS

| | | | | |
|---|---|---|---|---|
| 5,167,361 A | * | 12/1992 | Liebman et al. | 228/180.22 |
| 5,346,118 A | * | 9/1994 | Degani et al. | 228/180.22 |
| 5,411,199 A | * | 5/1995 | Suppelsa et al. | 228/179.1 |
| 5,620,927 A | * | 4/1997 | Lee | 29/841 |
| 5,945,735 A | * | 8/1999 | Economikos et al. | 257/710 |

* cited by examiner

*Primary Examiner*—Evan Pert
*Assistant Examiner*—Benjamin P. Sandvik

(57) ABSTRACT

A method (100) of attaching a shield (52 or 82) to a substrate (40) can include the steps of circumscribing a predetermined area on the substrate with a metallized trace pattern (26), applying (101) solder to the metallized trace pattern, and optionally placing (103) components (22 and 27) on portions of the metallized trace pattern. The method can further include the steps of reflowing (104) the solder to form a selective cladded trace pattern (32 or 62) on a portion of the metallized trace pattern reserved for the shield, placing (108) the shield on the cladded trace pattern, and reflowing (109) the substrate.

12 Claims, 3 Drawing Sheets

METHOD FOR ATTACHING SHIELDS ON SUBSTRATES

CROSS-REFERENCE TO RELATED APPLICATIONS

Not applicable.

FIELD OF THE INVENTION

This invention relates in general to the application of metals to substrates, and more particularly to efficiently attaching shields to substrates.

BACKGROUND OF THE INVENTION

Currently, there are two methods for attaching metallic shields to modules or printed circuit boards, namely using conductive epoxy or solder paste. Each of these current methods has several detriments. In the case of conductive epoxy, the conductive epoxy is dispensed on a shield track and the shield is placed over the conductive epoxy. In a cost sensitive manufacturing environment, the cost of conductive epoxy is one primary issue. Another issue is the dispensing and curing process. These two processes require dedicated equipment and increased cycle time. Finally, the reliability of the conductive epoxy bond is also an concern. Conductive epoxy could change its electrical characteristics over time due to oxidation. Additionally, conductive epoxy can fail to provide sufficient adhesion to hold a shield in place for some applications and would likely cause the shield to fall off the module during a drop.

The alternative current method involves dispensing of solder paste on a shield track and the placement of the shield over wet paste. Such method imposes clearance requirements between the shield track and adjacent components to avoid solder shorts. As a result, the module size is unnecessarily increased. As with the conductive epoxy, the dispensing process requires dedicated equipment. Another issue with current solder dispensing processes is that the volume of the solder paste might not be sufficient to compensate for shield non-coplanarity.

SUMMARY OF THE INVENTION

Embodiments in accordance with the invention illustrate an apparatus and methods to eliminate dispensing and curing operations required by conductive epoxy and a means to significantly improve the reliability of the bonds in a substrate module. Furthermore, embodiments herein can eliminate dispensing operations required by current solder paste dispensing operations for attaching shields to substrates. In addition, embodiments herein also enable the capability to compensate for shield non-coplanarity without increasing the size of the module.

In a first aspect of an embodiment in accordance with the present invention, a method of soldering a shield on a substrate can include the steps of applying solder onto conductive areas on the substrate including a conductive shield track for at least one shield, placing components, if any, to the conductive areas, reflowing the substrate providing a selectively solder cladded area over the conductive shield track, applying flux to one among the at least one shield and the selectively solder cladded area, and placing the shield over the selectively solder cladded area. The method further includes the step of reflowing the substrate including the shield over the solder cladded area.

In a second aspect, a method of attaching a shield to a substrate can include the steps of circumscribing a predetermined area on the substrate with at least a portion of a metallized trace pattern, applying solder to the metallized trace pattern, and placing components on portions of the metallized trace pattern. The method can further include the steps of reflowing the solder to form a cladded trace pattern on a portion of the metallized trace pattern reserved for the shield, placing the shield on the cladded trace pattern, and reflowing the substrate.

In a third aspect, a product having a substrate can include solder applied onto conductive areas on the substrate including a conductive shield track for at least one shield, at least one component placed onto the conductive areas, and a metallic shield. Note that the solder paste applied to the conductive shield track is reflowed providing a selectively solder cladded area over the conductive shield track and the metallic shield is placed over the solder cladded area which is reflowed again with the metallic shield.

In a fourth aspect, a processed printed circuit board can include a predetermined area on a substrate defined by a metallized trace pattern, solder applied to the metallized trace pattern, components placed on portions of the metallized trace pattern, and a shield placed over a cladded portion of the metallized trace pattern once the processed printed circuit board is reflowed a first time. Note that the processed printed circuit board is reflowed the first time and that the shield is placed over the cladded portion of the metallized trace pattern whereupon the processed printed circuit board is reflowed a second time.

DETAILED DESCRIPTION OF THE DRAWINGS

Figure 1:
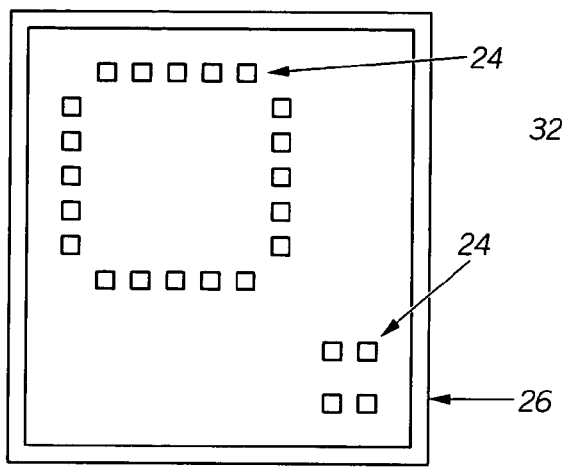
FIG. 1 shows a top view of a substrate illustrating conductive areas including a shield track circumscribing conductive component pads in accordance with the present invention.
Figure 4:
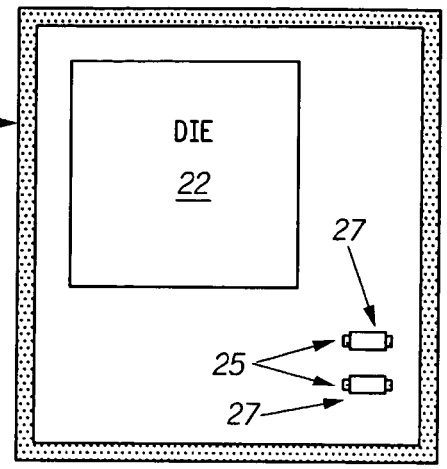
FIG. 4 illustrates a top view of the substrate of FIG. 2 after being populated with components in accordance with the present invention.
Figure 2:
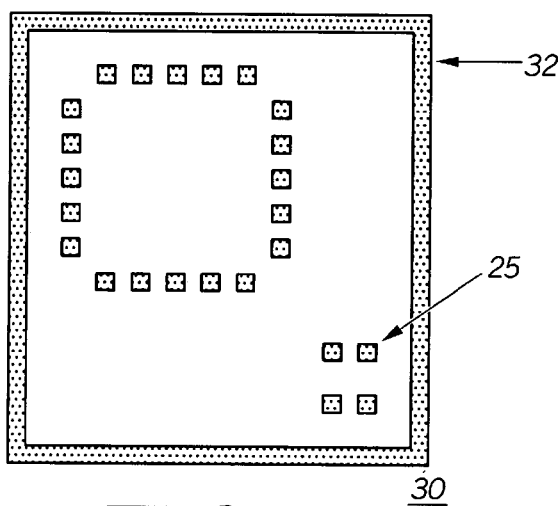
FIG. 2 shows a top view of the substrate of FIG. 1, further illustrating solder on top of the conductive areas in accordance with the present invention.

While the specification concludes with claims defining the features of several embodiments of the invention that are regarded as novel, it is believed that the invention will be better understood from a consideration of the following description in conjunction with the drawing figures, in which like reference numerals are carried forward.

Figure 5:
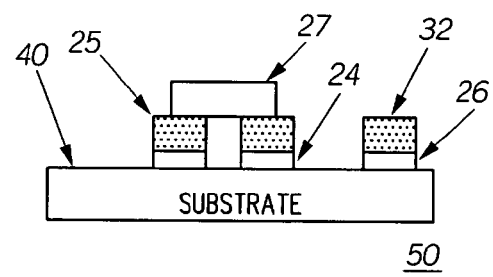
FIG. 5 illustrates a side view of a portion of the substrate of FIG. 4.
Figure 6:
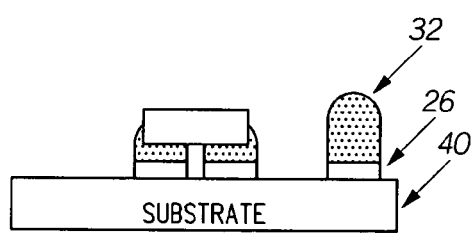
FIG. 6 shows a side view of a portion of the substrate of FIG. 5 after reflowing providing a cladded area in accordance with the present invention.
Figure 3:
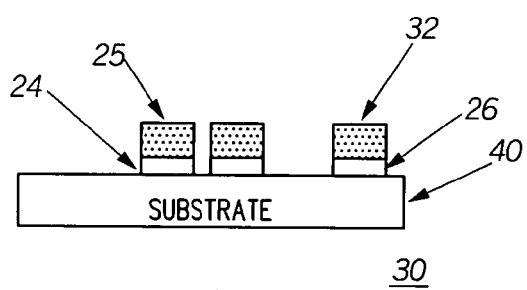
FIG. 3 shows a side view of a portion of the substrate of FIG. 2 before reflowing.
Figure 7:
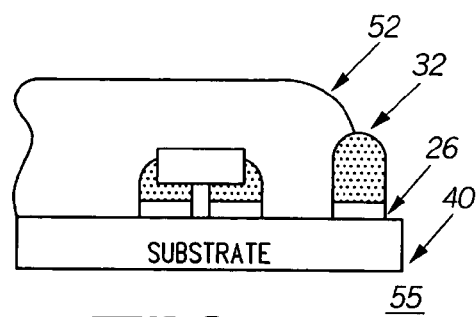
FIG. 7 illustrates a side view of a portion of the substrate of FIG. 6 further including a shield placed on the cladded area in accordance with the present invention.
Figure 8:
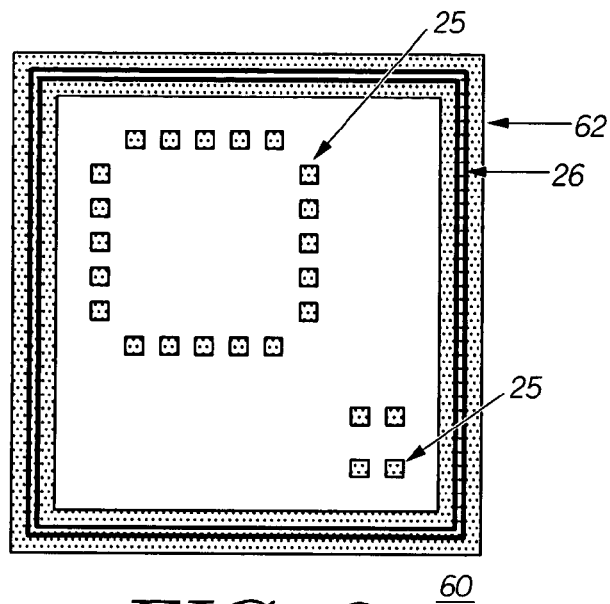
FIG. 8 shows a top view of the substrate of FIG. 1, further illustrating solder paste overprinted on top of the shield track in accordance with an embodiment of the present invention.
Figure 11:
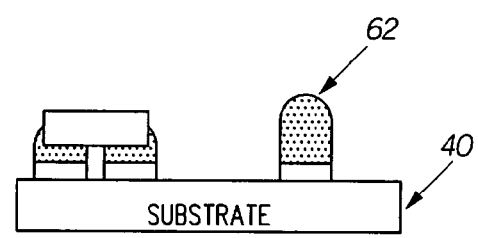
FIG. 11 shows a side view of a portion of the substrate of FIG. 10 after reflowing to create a selectively cladded area in accordance with an embodiment of the present invention.
Figure 9:
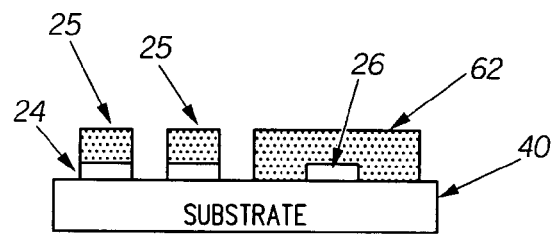
FIG. 9 shows a side view of a portion of the substrate of FIG. 8 before reflowing.
Figure 12:
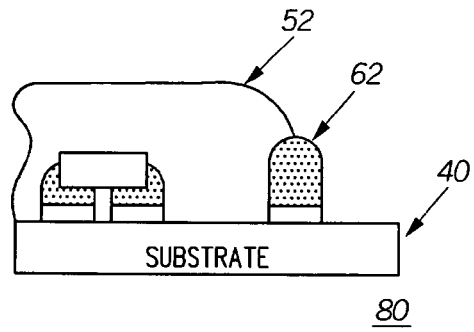
FIG. 12 illustrates a side view of a portion of the substrate of FIG. 11 further including a shield placed on the cladded area in accordance with the present invention.
Figure 10:
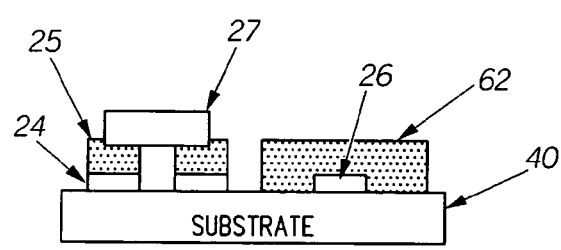
FIG. 10 illustrates a side view of the portion of the substrate of FIG. 9 further including components placed on solder printed areas before reflowing.

Referring now to FIGS. 1–12, a substrate assembly such as in the form of a processed printed circuit board 20 can include a predetermined area on a substrate 40 defined by a metallized trace pattern 26 serving as a shield track. The trace pattern can be created during the printed circuit board (PCB) manufacturing process. Thus, a preprinted PCB would include a pattern ready for solder application during a normal solder screen printing operation, for example. In this manner, a separate step (as done in attaching existing shields using conductive epoxy) is eliminated. A pre-printed PCB 30 or 60 (as shown in FIGS. 2 and 3 or 8 and 9) can include solder 25, 32 or 62 applied to the conductive areas on the substrate 40 including conductive solder pads 24 and the metallized trace pattern 26. The solder can be in the form of a solder preform, but more likely in the form of solder paste. As an example, solder paste can be placed on the trace pattern 26 and solder pads 24 using a screen printing process. After solder is applied to the PCB 30 or 60, the PCBs can be populated with components as required to complete a module 50 or 70. For example, the module 50 or 70 can be populated with electronic components 22 and 27 such as a semiconductor die or package and chip-capacitors respectively. The components are not necessarily limited to the semiconductor die and chip-capacitors or component packaging shown, but can alternatively include any other packaging and components including, but not limited to other discrete components or surface mounted components. The semiconductor die can use direct chip-attach or flip chip techniques (not shown) or can alternatively use wire bonding to wire bond pads on the periphery of the semiconductor die for providing suitable operational coupling. Before reflowing, the solder 32 or 62 lies on top of a metallized trace pattern 26 and solder 25 lies on top of conductive pads 24 on top of a substrate 40 as shown in FIG. 5 or 10. Once the solder 25 and 32 or 62 is reflowed as shown in FIGS. 6 and 11, a selectively cladded portion (32 and 62) is created on top of the trace pattern 26. In the case of a shield track, the trace pattern 26 serves the electrical function of ground. The height of the cladding (62) can be adjusted by overprinting the solder paste or applying predetermined amounts of solder preforms accordingly as illustrated in FIGS. 9 and 10. More solder paste or more solder preforms will naturally cause the solder to bead-up higher. Once the cladded portion is formed as shown in FIGS. 7 and 12, a metallic shield 52 or 82 respectively can be applied to the predetermined area providing a shielded module 55 or 80 which once again is reflowed.

Figure 13:
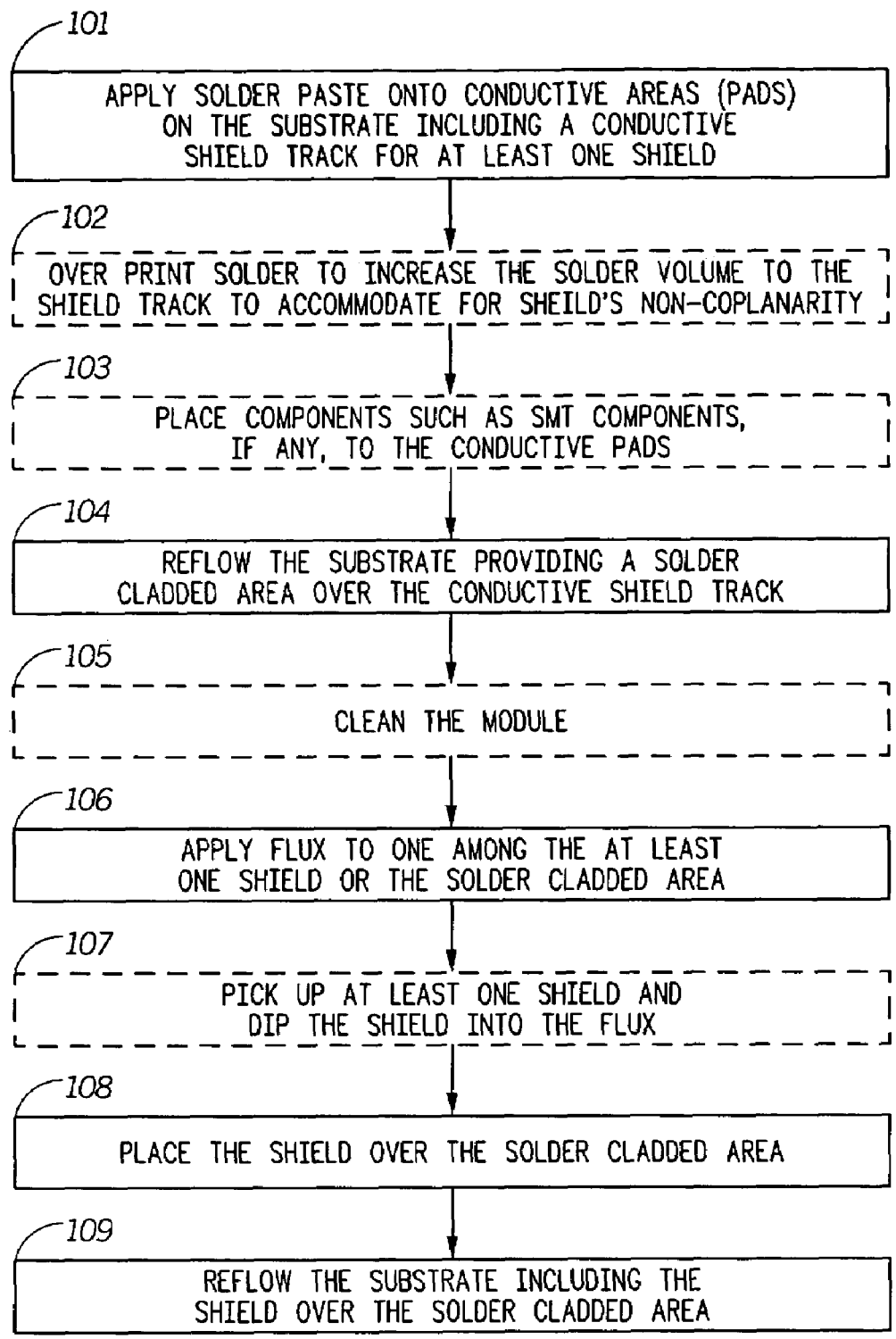
FIG. 13 is a flow chart illustrating a method of attaching a shield in accordance with an embodiment of the present invention.

Referring to FIG. 13, a method 100 of attaching a shield to a substrate or a printed circuit board (PCB) comprises the step 101 of applying solder paste onto conductive areas on the substrate or PCB including a conductive shield track for at least one shield. Alternatively, at step 102, the solder can be overprinted to adjust (increase) the solder volume to the conductive runners to accommodate for the non-coplanarity of a particular shield. At step 103, components such as surface mount components (if any) can be placed on the conductive areas whereupon the substrate or PCB module can be reflowed at step 104 providing a solder cladded area over the conductive shield track. Optionally, after reflowing, the PCB or substrate can be cleaned at step 105. At step 106, flux can be applied to at least one among the shield or the solder cladded area. Alternatively, at step 107, the shield can be picked up and dipped into the flux before placement of the shield on the solder cladded area at step 108. Lastly, the method 100 can include the step 109 of reflowing the module or PCB (including the shield over the solder cladded area.

Thus, the embodiments in accordance with the invention solves among other problems, the problem of insufficient clearance with other components. While the preferred embodiments of the invention have been illustrated and described, it will be clear that the invention is not so limited. For example, both pre-form and solder paste can be applied on a particular shield track pattern instead of just solder paste or pre-form only. Numerous modifications, changes, variations, substitutions and equivalents will occur to those skilled in the art without departing from the spirit and scope of the present invention as defined by the appended claims.

Additionally, the description above is intended by way of example only and is not intended to limit the present invention in any way, except as set forth in the following claims.

What is claimed is:

1. A method of soldering a shield on a substrate, comprising the steps of:
   applying solder onto conductive areas on the substrate including a conductive shield track for at least one shield;
   placing components, if any, onto the conductive areas for the components;
   reflowing the substrate thereby substantially simultaneously providing solder joints for the components and a selectively solder cladded area over the conductive shield track;
   applying flux to the to one among the at least one shield and the solder cladded area;
   placing the shield over the solder cladded area; and
   reflowing the substrate including the shield over the solder cladded area.

2. The method of claim 1, wherein the method further comprises the step of cleaning the substrate after reflowing the substrate when providing the solder cladded area.

3. The method of claim 1, wherein the step of applying flux further comprises the step of picking up the at least one shield and dipping the shield into the flux.

4. The method of claim 1, wherein the step of applying solder onto the conductive shield track comprises the step of over printing the solder to increase the solder volume to the conductive shield track to accommodate for the shield's non-coplanarity.

5. The method of claim 1, wherein the step of placing components comprises the step of placing surface mount components onto the substrate.

6. The method of claim 1, wherein the step of applying solder comprises the step of applying solder paste onto the conductive areas forming conductive pads for the components and the shield track.

7. The method of claim 1, wherein the step of applying solder comprises the step of applying solder preforms onto the conductive areas.

8. The method of claim 1, wherein the step of applying solder comprises the step of screen printing solder paste onto the conductive areas.

9. A method of attaching a shield to a substrate, comprising the steps of:
- circumscribing a predetermined area on the substrate with at least a portion of a metallized trace pattern;
- applying solder to the metallized trace pattern;
- placing components on portions of the metallized trace pattern;
- reflowing the solder to form substantially simultaneously a cladded trace pattern on a portion of the metallized trace pattern reserved for the shield and solder joints for the components;
- placing the shield on the cladded trace pattern; and
- reflowing the substrate.

10. The method of claim 9, wherein the step of applying solder comprises the step of applying solder paste to the metallized trace pattern.

11. The method of claim 9, wherein the step of applying the solder comprises the step of applying solder preform to the metallized trace pattern.

12. The method of claim 9, wherein the step of placing components comprises the step of placing a semiconductor die on portions of the metallized trace pattern.

* * * * *